(12) United States Patent
Asquini et al.

(10) Patent No.: US 9,197,197 B2
(45) Date of Patent: Nov. 24, 2015

(54) DUTY CYCLE PROTECTION CIRCUIT

(71) Applicants: STMicroelectronics S.A., Montrouge (FR); Mentor Graphics Corporation, Meudon la Foret (FR)

(72) Inventors: Anna Asquini, Corenc (FR); Vincent Vallet, Mennecy (FR)

(73) Assignees: STMICROELECTRONICS SA, Montrouge (FR); MENTOR GRAPHICS CORPORATION, Meudon la Foret (FR)

( * ) Notice: Subject to any disclaimer, the term of this patent is extended or adjusted under 35 U.S.C. 154(b) by 0 days.

(21) Appl. No.: 14/050,203

(22) Filed: Oct. 9, 2013

(65) Prior Publication Data

US 2014/0103972 A1 Apr. 17, 2014

(30) Foreign Application Priority Data

Oct. 11, 2012 (FR) ...................................... 12 59709

(51) Int. Cl.
*H03L 7/00* (2006.01)
*H03K 3/017* (2006.01)
*H03K 5/1252* (2006.01)
*G06F 1/10* (2006.01)
*G06F 1/12* (2006.01)

(52) U.S. Cl.
CPC *H03K 3/017* (2013.01); *G06F 1/10* (2013.01); *G06F 1/12* (2013.01); *H03K 5/1252* (2013.01)

(58) Field of Classification Search
USPC ......................................................... 327/142
See application file for complete search history.

(56) References Cited

U.S. PATENT DOCUMENTS

| 4,378,509 | A | * | 3/1983 | Hatchett et al. | ..................... 327/5 |
| 5,287,010 | A | * | 2/1994 | Hagiwara | ..................... 327/292 |
| 5,461,649 | A | | 10/1995 | Bailey et al. | |
| 5,642,068 | A | * | 6/1997 | Wojcicki et al. | ............... 327/172 |
| 6,188,259 | B1 | | 2/2001 | Amir et al. | |
| 6,831,493 | B2 | * | 12/2004 | Ma | ................. 327/175 |
| 2003/0090296 | A1 | * | 5/2003 | Yoo | ................. 327/12 |
| 2004/0268396 | A1 | | 12/2004 | Busson et al. | |
| 2006/0226897 | A1 | | 10/2006 | De Ruijter | |
| 2010/0202566 | A1 | | 8/2010 | Fudge et al. | |
| 2012/0182053 | A1 | * | 7/2012 | Yang | ............................. 327/119 |

FOREIGN PATENT DOCUMENTS

| EP | 0678990 | 10/1995 |
| EP | 0681364 | 11/1995 |

OTHER PUBLICATIONS

French Search Report and Written Opinion dated Mar. 11, 2013 from corresponding French Application No. 12/58735.

* cited by examiner

*Primary Examiner* — Lincoln Donovan
*Assistant Examiner* — Patrick Chen
(74) *Attorney, Agent, or Firm* — Allen, Dyer, Doppelt, Milbrath & Gilchrist, P.A.

(57) ABSTRACT

A duty cycle protection circuit including a first synchronous device adapted to receive a first clock signal on an input line and to generate a first clock transition of a second clock signal in response to a first clock transition of the first clock signal; and reset circuitry coupled to the input line and adapted to generate a second clock transition of the second clock signal by resetting the first synchronous device a time delay after the first clock transition of the first clock signal.

12 Claims, 2 Drawing Sheets

DUTY CYCLE PROTECTION CIRCUIT

CROSS REFERENCE TO RELATED APPLICATIONS

This application claims the priority benefit of French patent application serial number 12/59709, filed on Oct. 11, 2012, which is hereby incorporated by reference to the maximum extent allowable by law.

BACKGROUND

1. Technical Field

The present disclosure relates to a duty cycle protection circuit and to a method of adjusting the duty cycle of a clock signal.

2. Discussion of the Related Art

Clock repeaters (such as buffers or inverters), are used when a clock signal is to be transmitted across an integrated circuit. Clock repeaters boost the clock signal, thereby compensating for attenuation in the transmission line.

In some situations where the clock signal is transmitted over particularly long distances, for example of 10 mm or more, the number of clock repeaters present in the clock path can lead to distortion of the clock signal. In particular, local process variations and power supply noise can lead to asymmetry between the delay that the rising and falling clock transitions are subjected to by the clock repeaters, causing the duty cycle to be distorted. In extreme cases, such a duty cycle distortion over the length of the clock transmission line can lead to the clock signal becoming stuck at a logic low or logic high value, i.e. the clock signal no longer toggles.

There is a need in the art for circuitry to address the above problem of duty cycle distortion.

SUMMARY

It is an aim of embodiments to at least partially address one or more needs in the prior art.

According to one embodiment, there is provided a duty cycle protection circuit comprising: a first synchronous device adapted to receive a first clock signal on an input line and to generate a first clock transition of a second clock signal in response to a first clock transition of said first clock signal; and reset circuitry coupled to said input line and adapted to generate a second clock transition of said second clock signal by resetting said first synchronous device a time delay after said first clock transition of said first clock signal.

According to one embodiment, the reset circuitry comprises pulse generation circuitry adapted to generate a pulse for resetting said first synchronous device based on said first clock transition of said first clock signal.

According to another embodiment, the reset circuitry comprises a NAND gate having a first input coupled to an input node of the reset circuitry and a second input coupled to the input node of the reset circuitry via an inverter, said NAND gate generating said pulse for resetting said first synchronous device.

According to another embodiment, the reset circuitry comprises a delay element adapted to provide a delayed version of said first clock signal.

According to another embodiment, the reset circuitry is coupled to the input line via said first synchronous device or via a second synchronous device.

According to another embodiment, the reset circuitry is coupled to the input line via said first synchronous device, the reset circuitry receiving said second clock signal.

According to another embodiment, the reset circuitry is coupled to said input line via a second synchronous device, wherein said second synchronous device is adapted to generate a first clock transition of a third clock signal in response to said first clock transition of said first clock signal, said reset circuitry receiving said third clock signal.

According to another embodiment, the duty cycle protection circuit further comprises further reset circuitry adapted to receive the second clock signal and to generate a second clock transition of said third clock signal by resetting said second synchronous device a time delay after the first clock transition of the second clock signal.

According to another embodiment, the duty cycle protection circuit further comprises: one or more further synchronous devices adapted to clock a data signal based on said first clock signal; and an inverter adapted to invert said second clock signal in order to generate an output clock signal of the protection circuit.

According to another embodiment, there is provided an integrated circuit comprising a clock transmission line comprising at least one of the above duty cycle protection circuit.

According to another embodiment, there is provided a method of adjusting the duty cycle of a clock signal, the method comprising: receiving by a first synchronous device a first clock signal on an input line; generating by the first synchronous device a first clock transition of a second clock signal in response to a first clock transition of the first clock signal; and generating, by reset circuitry coupled to the input line, a second clock transition of the second clock signal by resetting the first synchronous device a time delay after the first clock transition of the first clock signal.

According to another embodiment, the reset circuitry is coupled to the input line via the first synchronous device or via a further synchronous device.

According to another embodiment, the reset circuitry is coupled to the input line via the first synchronous device, and receives the second clock signal.

According to another embodiment, the reset circuitry is coupled to the input line via a second synchronous device, the method further comprising generating by the second synchronous device a first clock transition of a third clock signal in response to the first clock transition of the first clock signal, the reset circuitry receiving the third clock signal.

BRIEF DESCRIPTION OF THE DRAWINGS

The foregoing and other purposes, features, aspects and advantages will become apparent from the following detailed description of embodiments, given by way of illustration and not limitation with reference to the accompanying drawings, in which.

DETAILED DESCRIPTION

Throughout the following, the term "couple" and its variants will be used to cover both direct and indirect connections, including connections made via one or more flip-flops.

Figure 1:
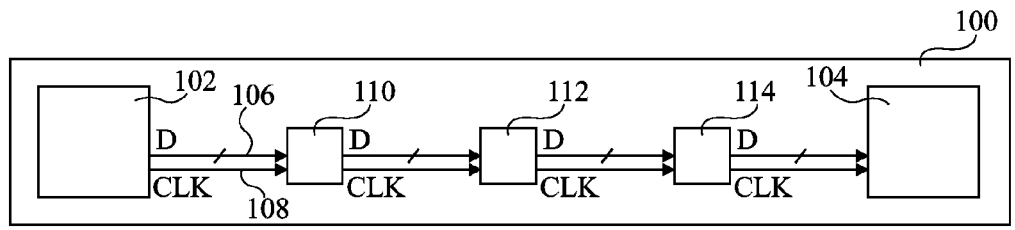
FIG. 1 schematically illustrates an integrated circuit according to an example embodiment.

FIG. 1 schematically illustrates a clock transmission system, in which an integrated circuit 100, for example an application specific integrated circuit (ASIC), comprises a first circuit block 102 configured to communicate with a second circuit block 104 via a data bus 106 and a clock bus 108. The circuit blocks 102 and 104 are, for example, separated by a relatively high distance, for example of 10 mm or greater. The data bus 106 for example comprises a plurality of transmission lines, while the clock bus 108 for example comprises a single transmission line, although in alternative embodiments the clock bus could comprise more than one transmission line.

A number of duty cycle protection circuits are interspaced along the data and clock buses. In the example of FIG. 1, three such circuits 110, 112 and 114 are provided, although in alternative embodiments any number could be used. Furthermore, while not illustrated in FIG. 1, a return path may be provided for communications from the circuit block 104 to the circuit block 102, for example comprising a further data bus and clock bus, again interspaced by corresponding duty cycle protection circuits.

Figure 2:
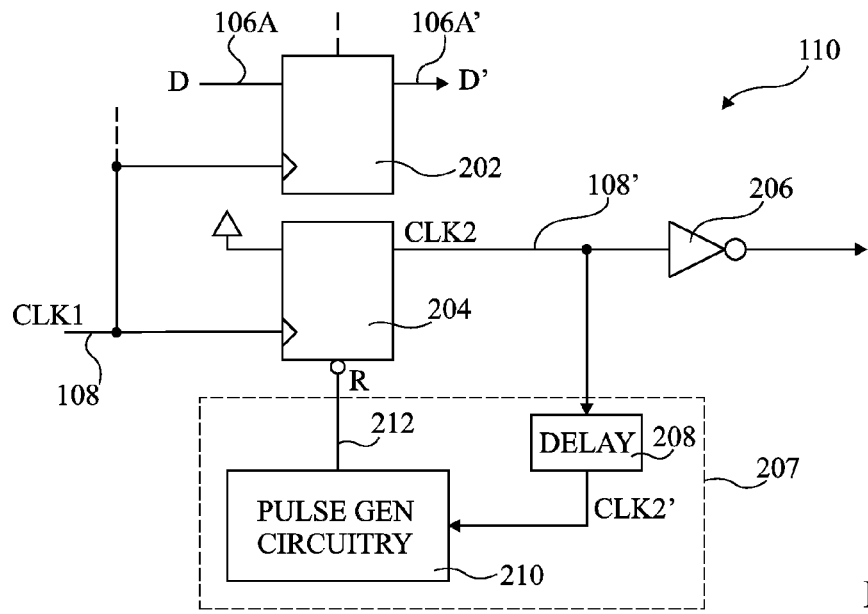
FIG. 2 schematically illustrates a duty cycle protection circuit according to an example embodiment.

FIG. 2 illustrates an example of the protection circuit 110 of FIG. 1 in more detail according to an example embodiment. The protection circuits 112 and 114 for example comprise identical circuitry.

As illustrated in FIG. 2, the clock signal CLK1 received on the clock bus 108 is provided to clock inputs of synchronous devices 202 and 204 respectively. Devices 202 and 204 are each for example D-type flip-flops, although other types of flip-flops or similar devices could be used. Flip-flop 202 receives a data signal D on an input data line 106A of the data bus 106, and provides an output data signal D' on a line 106A'. While not shown in FIG. 2, additional flip-flops 202 may be provided for other data lines of the data bus 106.

Flip-flop 204 has its data input tied to a logic "1" value, for example at a supply voltage VDD, and provides on an output line 108' a clock signal CLK2 generated based on the clock signal CLK1. Line 108' is for example coupled to an inverter 206, which provides at its output a clock signal to be transmitted to a subsequent stage, such as a subsequent protection circuit in the transmission path.

The line 108' is also coupled to reset circuitry 207 adapted to reset the synchronous device 204 after a configured time delay. The reset circuitry 207 for example comprises a delay element (DELAY) 208 and pulse generation circuitry (PULSE GEN CIRCUITRY) 210. The delay element 208 is for example a dedicated delay device, or could be implemented by a buffer, or by two or more inverters coupled in series. The delay element 208 delays the clock signal CLK2 to provide a delayed version CLK2', provided to the pulse generation circuitry 210. The pulse generation circuitry 210 provides a reset signal R comprising a pulse on a line 212 to a reset input of the flip-flop 204. In alternative embodiments, the delay element 208 could instead be coupled between the pulse generation circuitry 210 and the reset input of the flip-flop 204.

While in FIG. 2 the reset circuitry 207 is coupled to the clock input line 108 via the flip-flop 204, it will be apparent to those skilled in the art that in alternative embodiments described in more detail below with reference to FIG. 5, the reset circuitry 207 could be coupled to the clock input line 108 via another flip-flop, which is for example coupled in a similar fashion to flip-flop 204.

Figure 3:
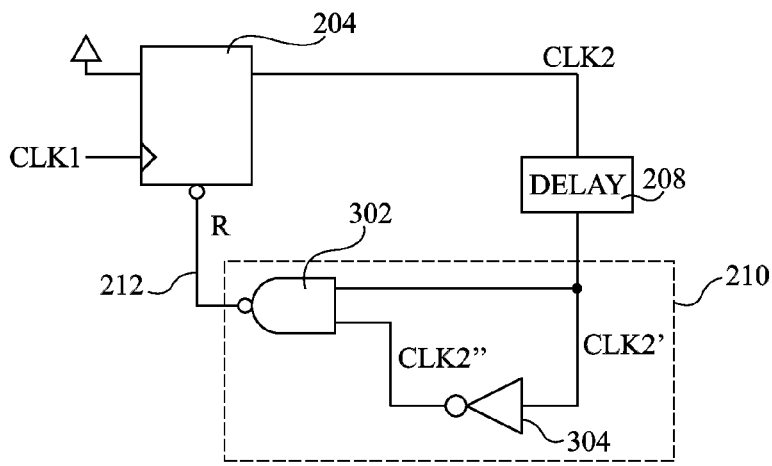
FIG. 3 schematically illustrates reset circuitry of the circuit of FIG. 2 in more detail according to an example embodiment.

FIG. 3 illustrates the reset circuitry 207 of FIG. 2 in more detail in the example that it is coupled to the output of flip-flop 204.

As illustrated in FIG. 3, the pulse generation circuitry 210 for example comprises a two-input NAND gate 302 having one input coupled to the output of delay element 208, and another input that receives a clock signal CLK2", which corresponds to the clock signal CLK2' at the output of delay element 208 after being inverted by an inverter 304. The output of NAND gate 302 provides the reset signal R on line 212 to the reset input of flip-flop 204.

Operation of the circuitry of FIGS. 2 and 3 will now be described in more detail with reference to the timing diagram of FIG. 4.

Figure 4:
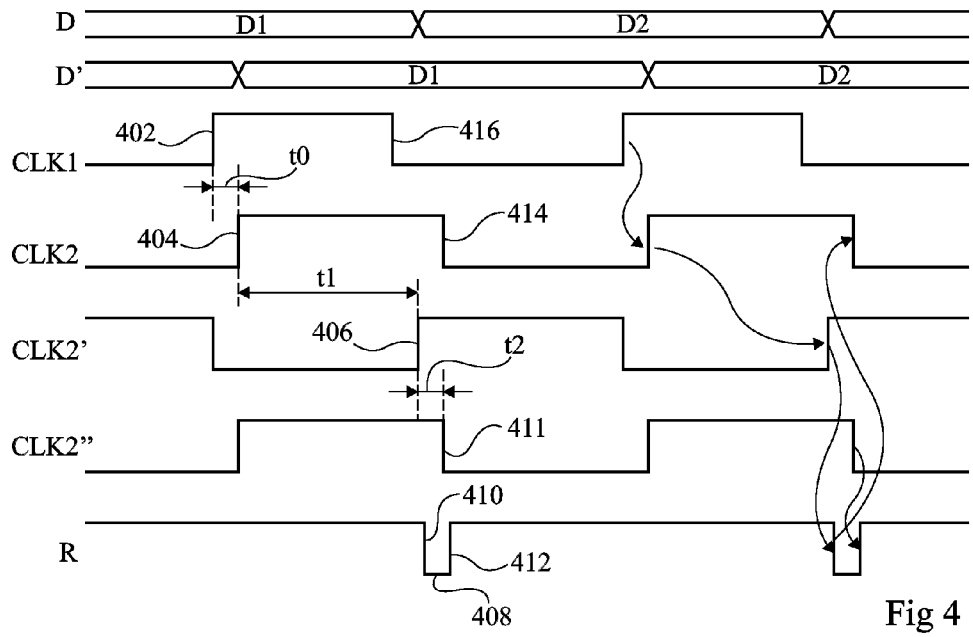
FIG. 4 is a timing diagram illustrating signals in the circuitry of FIGS. 2 and 3 according to an example embodiment.

FIG. 4 illustrates examples of the data signal D on line 106A, the data signal D' on line 106A', the clock signals CLK1, CLK2, CLK2', and CLK2", and the reset signal R.

A first transition 402 of the clock signal CLK1, which in this example is a rising edge, occurs approximately midway through a data value D1 of the data signal D.

In response to the clock transition 402, the flip-flop 204 generates a first clock transition 404 of the clock signal CLK2 a time delay t0 after the transition 402. The delay element 208 introduces a time delay t1 to the clock signal CLK2 to generate the signal CLK2' shown in FIG. 4, having a clock transition 406 delayed by time delay t1 with respect to the clock transition 404 of the clock signal CLK2. As explained in more detail below, the time delay t1 is for example close to half the clock period of the clock signal CLK1.

The pulse generation circuitry 210 transforms the clock transition 406 of the delayed clock signal CLK2' into a pulse 408 of the reset signal R, which is a negative pulse in the example of FIG. 4. In particular, the clock transition 406 is for example a rising edge, bringing the two inputs of the NAND gate 302 to a logic high level, and causing a falling edge 410 of the reset signal R. A time delay t2 after the clock transition 406, the signal CLK2" at the output of inverter 304 has a falling edge 411, which will in turn cause a rising edge 412 of the reset signal R. Thus the negative reset pulse has a duration equal to the delay introduced by the inverter 304.

The falling edge 410 of the reset signal causes a clock transition 414 of the clock signal CLK2, in particular a falling edge which occurs at approximately half a clock period after the rising edge 404 of the clock signal CLK2. In particular, the time delay between the rising edge 404 and falling edge 414 of the clock signal CLK2 is equal to the time delay t1 introduced by delay element 208 plus the delay introduced by the NAND gate 302 and by the reset input of the flip-flop 204 in response to the rising edge 406 of signal CLK2". Thus this time delay can be configured to a relatively high precision, for example by choosing an appropriate value of the delay provided by element 208.

It will be noted that, in the example of the FIG. 4, a falling edge 416 of the clock signal CLK1 is offset with respect to its ideal position, due to a duty cycle distortion of the signal. However, because the edge 416 is not used to generate the falling clock edge 414 of the clock signal CLK2, this distortion of the clock edge is not propagated.

As shown in FIG. 4, the sequence of signals described above repeat for subsequent rising clock edges of the clock signal CLK1.

It will also be noted that the data signal D', which has been synchronized using the clock signal CLK1, has data transitions falling at substantially the same time as the rising edges of a clock signal CLK2. Thus, the falling edges of the clock signal CLK2 are well positioned for clocking this data signal D' at a subsequent stage. Inverter 206 of FIG. 2 converts these falling edges into rising edges that are thus adapted for performing this function.

Figure 5:
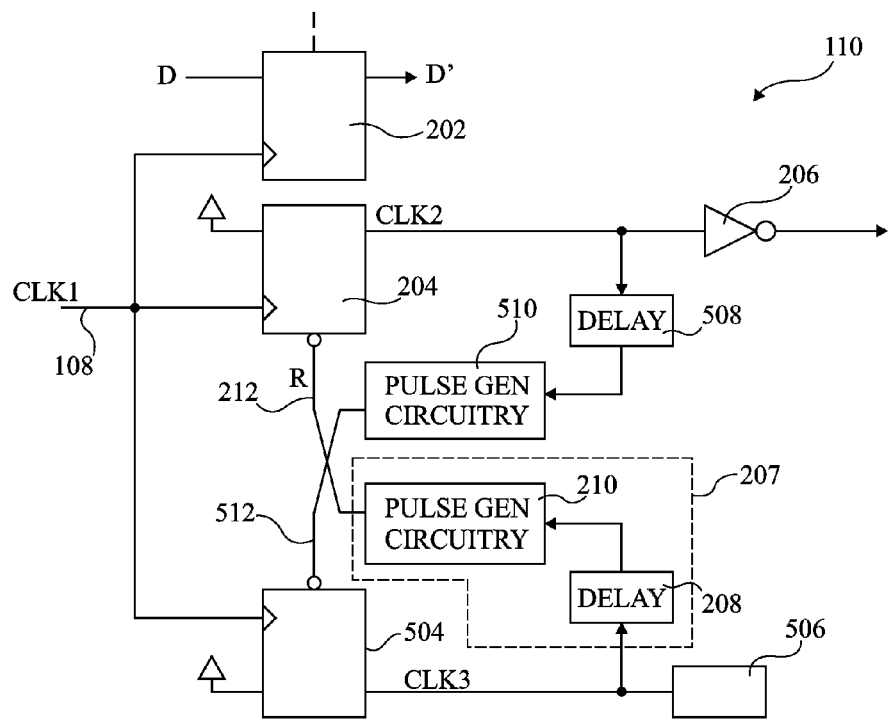
FIG. 5 schematically illustrates a clock signal duty cycle protection circuit according to a further example embodiment.

FIG. 5 illustrates the duty cycle protection circuit 110 according to an alternative embodiment. Those features in common with the embodiment of FIG. 2 have been labeled with like reference numerals and will not be described again in detail.

In the embodiment of FIG. 5 the reset circuitry 207 receives the clock signal CLK1 via a further flip-flop 504, rather than via the flip-flop 204. In particular, the flip-flop 504 has its data input tied to a logic "1" value, and its clock input coupled to the input line 108 for receiving the clock signal CLK1. The output of flip-flop 504 provides a clock signal CLK3, which corresponds very closely to the signal CLK2. Rather than being coupled to inverter 206, the output of flip-flop 504 is coupled to a dummy load 506, which presents similar load characteristics to the inverter 206. The output of flip-flop 504 is also coupled to the reset circuitry 207, which provides the reset signal on line 212. The flip-flop 504 is, for example, reset by further reset circuitry comprising a delay element (DELAY) 508 and pulse generation circuitry (PULSE GEN CIRCUITRY) 510, which for symmetry are for example identical to the corresponding blocks of the reset circuitry 207. However, it will be apparent to those skilled in the art that the delay introduced by delay element 508 need not correspond to exactly that of delay element 208.

An advantage to the embodiments described herein is that the duty cycle of a clock signal may be adjusted in a simple fashion, thereby preventing clock signal distortion. Furthermore, the protection circuit comprises relatively few components, and therefore uses relatively low silicon area.

An advantage of the embodiment of FIG. 5 is that there is no timing loop from the output of flip-flop 204 back to its reset input, thereby making the circuit better adapted for static timing analysis, and in particular to allow the propagation delay of the rising clock edge to be characterized.

While a number of example embodiments have been described, it will be apparent to those skilled in the art that there are various modifications and improvements that could be applied.

For example, it will be apparent to those skilled in the art that the logic devices controlled by a rising clock edge could instead be adapted to be controlled by a falling clock edge, and vice versa.

Furthermore, it will be apparent to those skilled in the art that the features described in relation to the various embodiments could be combined in alternative embodiments in any combination.

Furthermore, it will be apparent to those skilled in the art that the circuits described herein could be adapted to common ASIC manufacturing test methodologies, which will be well known to those skilled in the art.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A duty cycle protection circuit comprising:
a first synchronous device adapted to receive a first clock signal on an input line and to generate a first clock transition of a second clock signal in response to a first clock transition of said first clock signal; and
reset circuitry coupled to said input line and adapted to generate a second clock transition of said second clock signal by resetting said first synchronous device a time delay after said first clock transition of said first clock signal;
said reset circuitry comprising a delay element adapted to provide a delayed version of said second clock signal, and pulse generation circuitry coupled to said delay element;
said pulse generation circuitry comprising a logic gate having first and second inputs coupled to the delay element;
said first input being adapted to directly receive the delayed version of said second clock signal, and said second input being adapted to directly receive an inverted version of the delayed version of said second clock signal;
said pulse generation circuitry adapted to generate a pulse for resetting said first synchronous device based on said first clock transition of said first clock signal.

2. The duty cycle protection circuit of claim 1, wherein said logic gate comprises a NAND gate having the first input coupled to an input node of the pulse generation circuitry and the second input coupled to the input node of the pulse generation circuitry, said NAND gate generating said pulse for resetting said first synchronous device.

3. The duty cycle protection circuit of claim 1, wherein said reset circuitry is coupled to said input line via said first synchronous device.

4. The duty cycle protection circuit of claim 1, wherein said reset circuitry is coupled to said input line via said first synchronous device, said reset circuitry receiving said second clock signal.

5. The duty cycle protection circuit of claim 1, further comprising:
at least one additional synchronous device adapted to clock a data signal based on said first clock signal; and
an inverter adapted to invert said second clock signal to generate an output clock signal of said duty cycle protection circuit.

6. A method of adjusting a duty cycle of a clock signal, the method comprising:
operating a first synchronous device to receive a first clock signal on an input line and to generate a first clock transition of a second clock signal in response to a first clock transition of the first clock signal; and
operating reset circuitry coupled to the input line and to generate a second clock transition of the second clock signal by resetting the first synchronous device a time delay after the first clock transition of the first clock signal;
the reset circuitry comprising a delay element for providing a delayed version of the second clock signal, and pulse generation circuitry coupled to the delay element;
the pulse generation circuitry comprising a logic gate having first and second inputs coupled to the delay element;
the first input for directly receiving the delayed version of the second clock signal, and the second input for directly receiving an inverted version of the delayed version of the second clock signal;
the pulse generation circuitry for generating a pulse for resetting the first synchronous device based on the first clock transition of the first clock signal.

7. The method of claim 6, wherein the logic gate comprises a NAND gate having the first input coupled to an input node of the pulse generation circuitry and the second input coupled to the input node of the pulse generation circuitry, the NAND gate generating the pulse for resetting the first synchronous device.

8. The method of claim 6, wherein the reset circuitry is coupled to the input line via the first synchronous device.

9. The method of claim 6, wherein the reset circuitry is coupled to the input line via the first synchronous device, the reset circuitry receiving the second clock signal.

10. The method of claim 6, wherein the reset circuitry is coupled to the input line via a second synchronous device; and further comprising operating the second synchronous device to generate a first clock transition of a third clock signal in response to the first clock transition of the first clock signal, the reset circuitry receiving the third clock signal.

11. The method of claim 10, further comprising operating additional reset circuitry to receive the second clock signal, and to generate a second clock transition of the third clock signal by resetting the second synchronous device a time delay after the first clock transition of the second clock signal.

12. The method of claim 6, further comprising:
   operating at least one additional synchronous device to clock a data signal based on the first clock signal; and
   operating an inverter to invert the second clock signal to generate an output clock signal of the duty cycle protection circuit.

* * * * *